US009196984B2

(12) United States Patent
Ishida et al.

(10) Patent No.: US 9,196,984 B2

(45) Date of Patent: Nov. 24, 2015

(54) SUBSTRATE CONNECTION STRUCTURE USING SUBSTRATE CONNECTOR

(71) Applicant: SMK Corporation, Tokyo (JP)

(72) Inventors: Yoshiyasu Ishida, Tokyo (JP); Fumio Ohsawa, Tokyo (JP); Kiyoshi Asai, Yokohama (JP)

(73) Assignee: SMK Corporation, Tokyo (JP)

( * ) Notice: Subject to any disclaimer, the term of this patent is extended or adjusted under 35 U.S.C. 154(b) by 26 days.

(21) Appl. No.: 14/159,385

(22) Filed: Jan. 20, 2014

(65) Prior Publication Data

US 2014/0315419 A1 Oct. 23, 2014

(30) Foreign Application Priority Data

Apr. 19, 2013 (JP) ................................. 2013-088043

(51) Int. Cl.

| | |
|---|---|
| ***H01R 12/00*** | (2006.01) |
| ***H05K 1/00*** | (2006.01) |
| ***H01R 13/64*** | (2006.01) |
| ***H01R 3/00*** | (2006.01) |
| ***H01R 12/71*** | (2011.01) |
| ***H01R 12/70*** | (2011.01) |
| *H01R 13/631* | (2006.01) |
| *H01R 13/641* | (2006.01) |
| *H01R 12/50* | (2011.01) |
| *H01R 12/57* | (2011.01) |
| *H01R 13/639* | (2006.01) |
| *H01R 13/629* | (2006.01) |
| *H01R 13/627* | (2006.01) |
| *H01R 12/73* | (2011.01) |
| *H01R 13/20* | (2006.01) |

(52) U.S. Cl.

CPC .......... *H01R 12/716* (2013.01); *H01R 12/7052* (2013.01); *H01R 9/096* (2013.01); *H01R 12/57* (2013.01); *H01R 12/73* (2013.01); *H01R 13/20* (2013.01); *H01R 13/629* (2013.01); *H01R 13/6272* (2013.01); *H01R 13/631* (2013.01); *H01R 13/639* (2013.01); *H01R 13/64* (2013.01); *H01R 13/641* (2013.01); *H01R 23/725* (2013.01)

(58) Field of Classification Search

CPC .... H01R 23/725; H01R 13/64; H01R 13/631; H01R 13/629; H01R 13/641; H01R 13/6272; H01R 13/639; H01R 9/096; H01R 12/57

USPC .................................... 439/74, 374, 378, 489

See application file for complete search history.

(56) References Cited

U.S. PATENT DOCUMENTS 7,195,494 B2 * 3/2007 Ookura ........................... 439/74

FOREIGN PATENT DOCUMENTS

JP 2010-097724 A 4/2010

*Primary Examiner* — Abdullah Riyami

*Assistant Examiner* — Justin Kratt

(57) ABSTRACT

Provided is a substrate connection structure using a substrate connector capable of: ensuring a sufficient distance for adjusting positional misalignment even when the size and height of the substrate connector are reduced; preventing connector breakdown during the connecting operation thereof; and visually checking the connection thereof. A guide protrusion is provided at a mate-side end face of a guided portion so as to protrude farther beyond a mate-side substrate mounting surface when the plug is fitted into the socket. A first-side guide face is formed in an edge portion of an opening in a guide groove and the guide protrusion is provided with a second-side guide face slidable with the first-side guide face so as to lead the guided portion into the guide groove. Also, interference between the guide protrusion and the mate-side substrate is prevented from occurring.

3 Claims, 23 Drawing Sheets

SUBSTRATE CONNECTION STRUCTURE USING SUBSTRATE CONNECTOR

CROSS-REFERENCE TO RELATED APPLICATION

The contents of the following Japanese patent application are incorporated herein by reference, NO. 2013-088043 filed on Apr. 19, 2013.

TECHNICAL FIELD

The present invention relates to a substrate connection structure using a substrate connector employed for substrate-to-substrate connection.

BACKGROUND

A substrate connector including: a plug having a plug portion of an elongated and protruded shape with a plurality of plug-side signal terminals arranged along an outer side surface thereof; and a socket having a plug insertion groove into which the plug portion is to be inserted and a plurality of socket-side signal terminals arranged along an inner side surface of the plug insertion groove has been conventionally employed in order to electrically connect substrates. Electrical connection is achieved by connecting the plug to the socket in such a manner that the plug portion is fitted into the plug insertion groove and the above-described both signal terminals are resiliently brought into contact with each other.

Such a substrate connector includes: guiding portions provided at opposite ends of the socket in the longitudinal direction and each having a rectangular guide groove directed in a connection direction; and cuboid guided portions provided at opposite ends of the plug in the longitudinal direction. A side surface of the guided portion in the width direction and an end face thereof in the longitudinal direction are guided by an inner side surface of the guide groove, thereby enabling the plug portion to be fitted into the plug insertion groove at a predetermined position (see Patent Literature 1, for example).

The substrate connector also includes a guide face formed at an edge portion of an opening in the guide groove by a slant surface slanted downwardly toward the inner side. If a relative position between the socket and the plug is misaligned in the horizontal direction during a connecting operation thereof, a slant surface formed at a side edge or end of the guided portion is slid over the guide face, thereby leading the guided portion to the guide groove. It is therefore possible to absorb such misalignment.

RELATED ART

Patent Literature

Patent Literature 1: Japanese Patent Application Publication No. 2010-97724

SUMMARY

With the conventional technique as described above, however, along with a reduction in size and height of the connector, a peripheral wall portion of the guiding portion around the guide groove is made thinner, thereby failing to sufficiently ensure the distance of the guide slant surface in the horizontal direction. Therefore, an acceptable range for positional misalignment in the horizontal direction when connecting the plug to the socket is narrowed, resulting in a reduction in the efficiency of the connecting operation. In some cases, the plug and the socket may come into contact with each other at an unintended portion during the connecting operation, possibly resulting in the breakdown of the connector.

In the substrate-to-substrate connection using the substrate connector, there is also the problem that it is difficult to visually check the connected portion due to the existence of the respective substrates interrupting one's view when connecting the plug and the socket mounted on the substrates.

In view of such problems in the conventional technique, it is an object of the present invention to provide a substrate connection structure using a substrate connector capable of: ensuring a sufficient distance for adjusting positional misalignment even when the size and height of the substrate connector are reduced; preventing connector breakdown during the connecting operation thereof; and visually checking the connection thereof.

In order to solve the problems in association with the conventional technique as described above and achieve the desired object, a first aspect of the present invention provides a substrate connection structure using a substrate connector, the substrate connector including a plug and a socket to be mounted on substrates, respectively, and fitted together, one of the plug and the socket including a guiding portion having a guide groove directed in a connection direction, the other of the plug and the socket including a guided portion to be fitted into the guide groove, the guided portion being guided by an inner side surface of the guide groove, thereby enabling the plug to be fitted into the socket at a predetermined position, wherein a guide protrusion is provided at a mate-side end face of the guided portion and/or the guiding portion so as to protrude farther beyond a mate-side substrate mounting surface when the plug is fitted into the socket, a first-side guide face is formed in the guided portion or an edge portion of an opening in the guide groove and the guide protrusion is provided with a second-side guide face slidable with the first-side guide face so as to lead the guided portion into the guide groove, and interference between the guide protrusion and the mate-side substrate is prevented from occurring.

In accordance with a second aspect of the present invention, an escape hole, in communication with the guide groove and passing completely through the mate-side substrate mounting surface, is provided in the guiding portion and the guide protrusion provided in the guided portion protrudes farther beyond the mate-side substrate mounting surface through the escape hole in addition to the configuration according to the first aspect.

In accordance with a third aspect of the present invention, an escape cutout portion having a hole shape or a cutout shape for the guide protrusion to be inserted therein is provided in the substrate in addition to the configuration according to the first or second aspect.

As described above, a substrate connection structure using a substrate connector according to the present invention employs a substrate connector including a plug and a socket to be mounted on substrates, respectively, and fitted together. One of the plug and the socket includes a guiding portion having a guide groove directed in a connection direction, and the other of the plug and the socket includes a guided portion to be fitted into the guide groove. The guided portion is guided by an inner side surface of the guide groove, thereby enabling the plug to be fitted into the socket at a predetermined position. In such a substrate connection structure, a guide protrusion is provided at a mate-side end face of the guided portion and/or the guiding portion so as to protrude farther beyond a mate-side substrate mounting surface when the plug is fitted into the socket. A first-side guide face is formed in the guided portion or an edge portion of an opening in the guide groove and the guide protrusion is provided with a second-side guide face slidable with the first-side guide face so as to lead the guided portion into the guide groove. Also, interference between the guide protrusion and the mate-side substrate is prevented from occurring. It is therefore possible to ensure a sufficient distance for adjusting positional misalignment while achieving a reduction in size and height of the overall connector. It is further possible to promote efficiency in the connecting operation.

Moreover, according to the present invention, an escape hole, in communication with the guide groove and passing completely through the mate-side substrate mounting surface, is provided in the guiding portion and the guide protrusion provided in the guided portion protrudes farther beyond the mate-side substrate mounting surface through the escape hole. Thus, the guide protrusion can be provided in the guided portion and it is possible to ensure a sufficient distance for adjusting positional misalignment while achieving a reduction in size and height of the overall connector.

Furthermore, according to the present invention, an escape cutout portion having a hole shape or a cutout shape for the guide protrusion to be inserted therein is provided in the substrate. It is thereby possible to avoid interference between the guide protrusion and the substrate. It is also possible to visually check the positions of the plug and the socket, thereby improving the operation efficiency. Also, a distance between the substrates can be kept small even when the guide protrusion is provided.

DETAILED DESCRIPTION

Figure 1A:
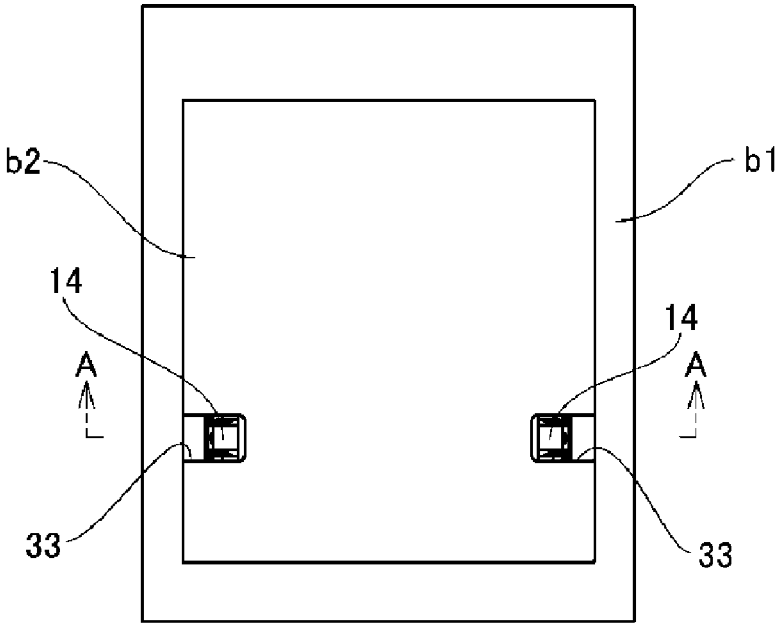
FIG. 1A is a plan view illustrating an example of a substrate connection structure using a substrate connector according to the present invention.

A first embodiment of a substrate connection structure using a substrate connector according to the present invention will now be described based on examples illustrated in FIGS. 1 to 9D. In these figures, reference numerals b1 and b2 denote substrates, respectively. The substrate b1 may be a PCB, and the substrate b2 may be an FPC, for example.

A substrate connector 1 is used for the substrate-to-substrate connection. The substrate b1 and the substrate b2 are connected to each other via the substrate connector 1.

Figure 1B:
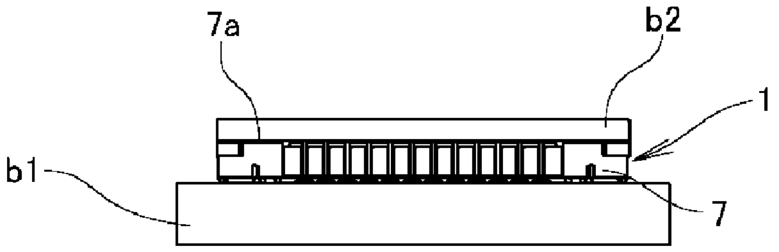
FIG. 1B is an elevation view of the same.
Figure 1C:
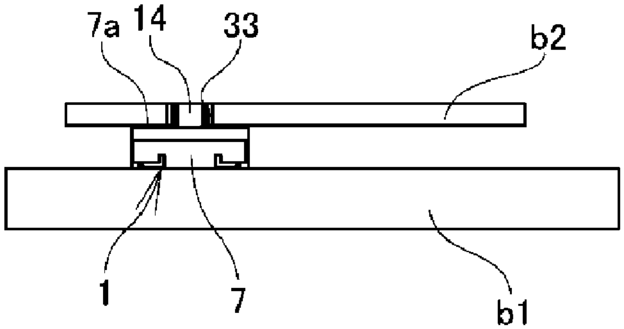
FIG. 1C is a side view of the same.
Figure 2:
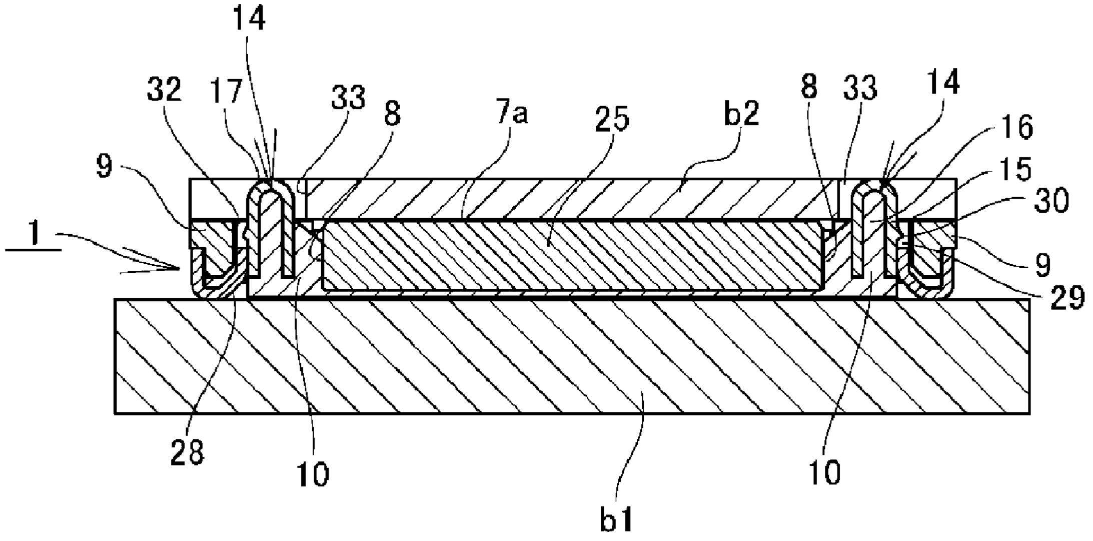
FIG. 2 is a partial enlarged cross-sectional view taken along line A-A of FIG. 1A.
Figure 3:
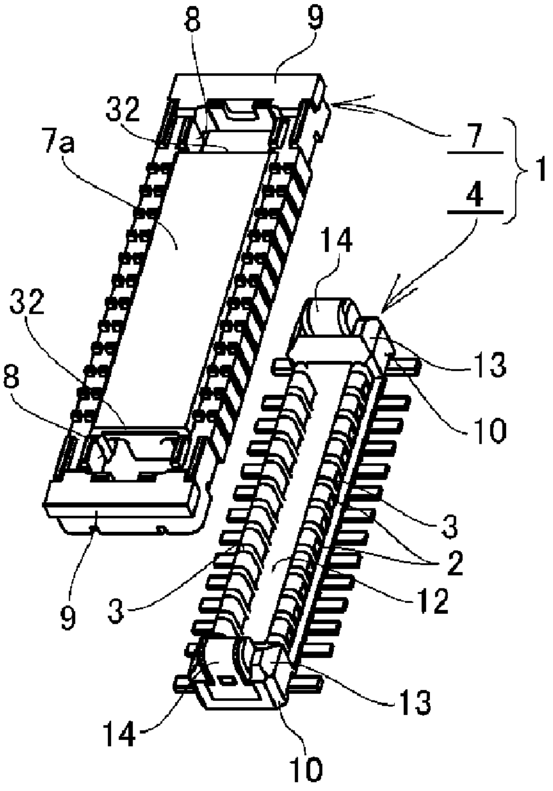
FIG. 3 is a perspective view illustrating the substrate connector of FIGS. 1A to 1C.
Figure 4:
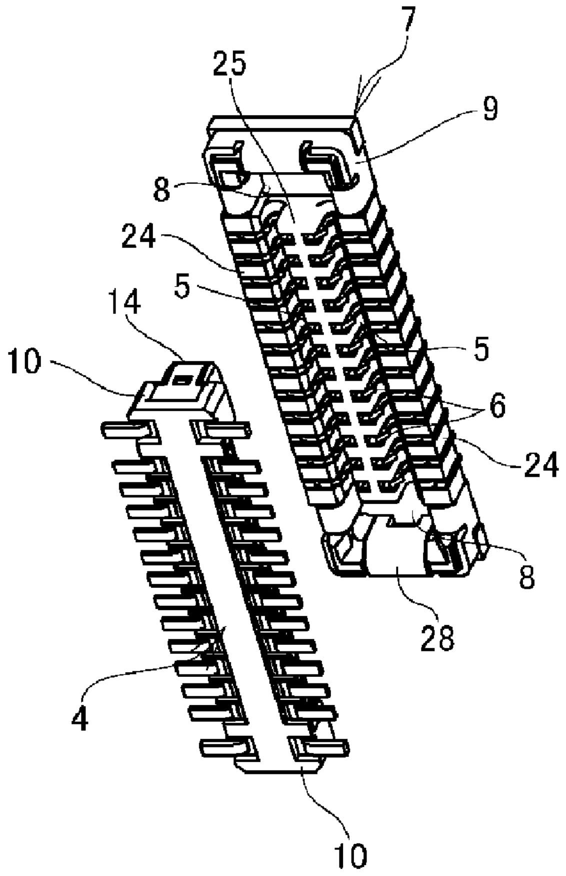
FIG. 4 is a perspective view illustrating the same substrate connector as viewed from another direction.

As illustrated in FIGS. 1A to 1C, the substrate connector 1 includes a plug 4 and a socket 7. The plug 4 has plug portions 3 each having an elongated and protruded shape. The plug portion 3 includes a plurality of plug-side signal terminals 2 arranged along a lateral portion thereof. The socket 7 includes a plurality of socket-side signal terminals 6 arranged along inner side surface portions of plug insertion grooves 5 into which the plug portions 3 are to be inserted. Fitting the plug portions 3 into the plug insertion grooves 5 achieves the connection between the plug-side signal terminals 2 and the socket-side signal terminals 6. As a result, the substrates b1 and b2 with the plug 4 and the socket 7 mounted thereon, respectively, are electrically connected to each other via these signal terminals 2 and 6.

Note that a description in the present embodiment will be made with a longitudinal direction of the plug portion 3 being referred to as a longitudinal direction, a horizontal direction perpendicular to the longitudinal direction as a width direction, and a direction in which the plug 4 and the socket 7 face each other as a connection direction.

According to the substrate connector 1, the socket 7 is provided with guiding portions 9, each having a guide groove 8 directed in the connection direction, and the plug 4 is provided with guided portions 10 to be fitted into the guide grooves 8. When connecting the plug 4 and the socket 7 together, the guided portion 10 is guided by an inner side surface of the guide groove 8, thereby enabling the plug portions 3 to be fitted into the respective plug insertion grooves 5 at predetermined positions.

Figure 5A:
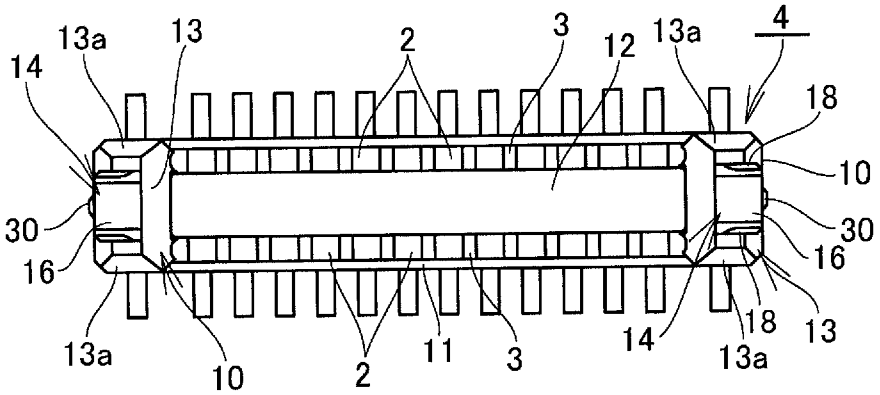
FIG. 5A is a plan view illustrating a plug of FIGS. 1A to 1C.
Figure 5B:
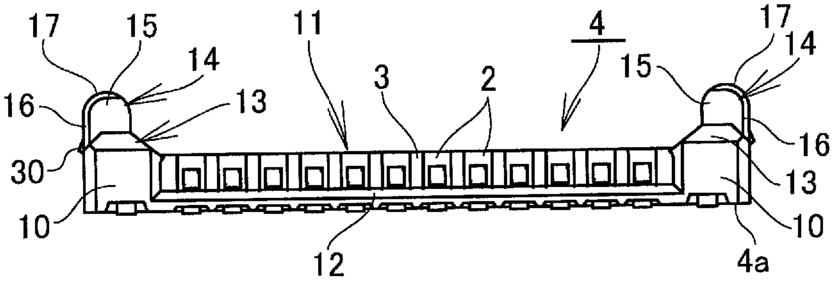
FIG. 5B is an elevation view of the same.
Figure 5C:
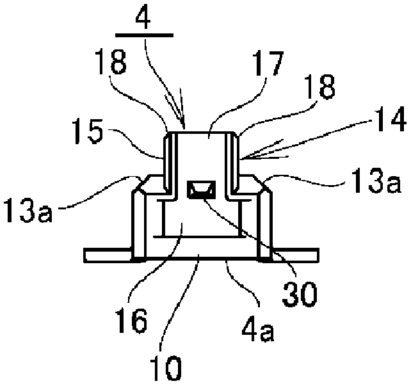
FIG. 5C is a side view of the same.
Figure 6A:
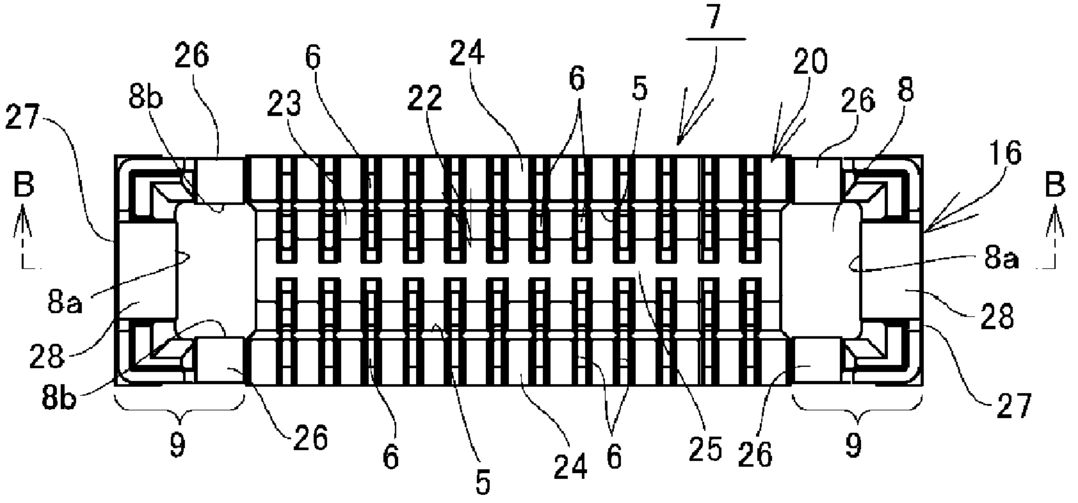
FIG. 6A is a plan view illustrating a socket of FIGS. 1A to 1C.
Figure 6B:
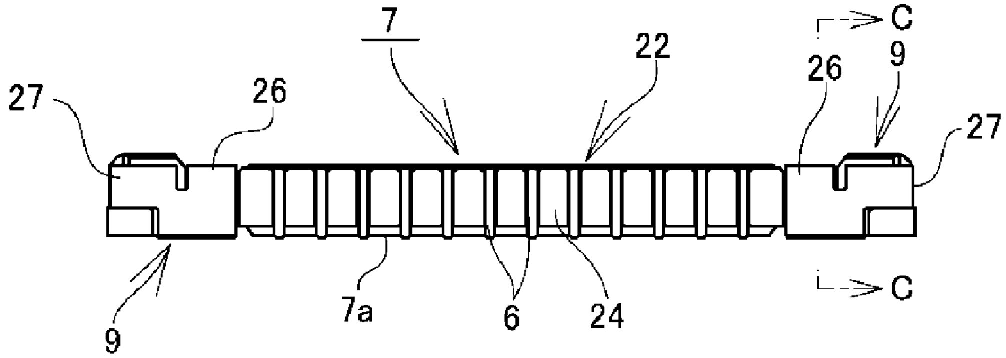
FIG. 6B is an elevation view of the same.
Figure 6C:
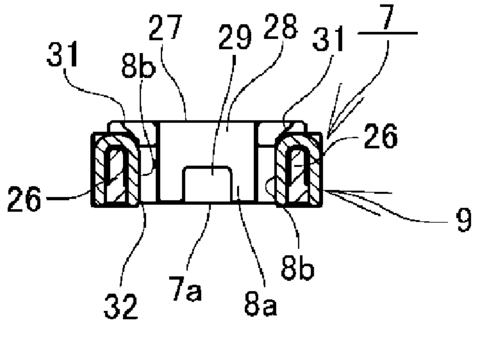
FIG. 6C is a cross-sectional view taken along line C-C of FIG. 6B.
Figure 6D:
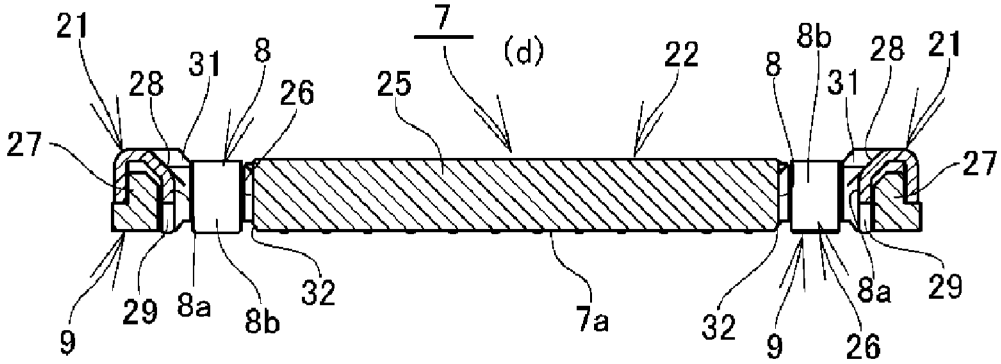
FIG. 6D is a cross-sectional view taken along line B-B of FIG. 6A.

As illustrated in FIGS. 5A to 5C, the plug 4 includes a plug main body 11 made of an insulating resin and having the plug portions 3 of an elongated and protruded shape. The plurality of plug-side signal terminals 2 are integrated with the plug main body 11 by means of insert molding.

The plug main body 11 is integrally formed with an insulating synthetic resin. The plug main body 11 includes: a main body base 12 of a flat-plate shape; the plug portions 3 each having an elongated and protruded shape, protruded from a surface of the main body base 12 and extending in the longitudinal direction; and the guided portions 10 disposed at opposite ends thereof in the longitudinal direction. The main body base 12 and the plug portions 3 together form a shape such that U-shaped cross sections continuously appear in the longitudinal direction. Also, the plug portions 3 and the guided portions 10 disposed at the opposite ends thereof together form a rectangular frame shape as viewed from above.

The guided portion 10 is formed in a cuboid shape. The guided portion 10 integrally has a guide slant portion 13, having a shape bulging toward the socket 7 (the mate side thereof), on a socket-side end face thereof.

The guide slant portion 13 is formed in such a manner that a height of the socket-side end face thereof is greater than that of the plug portions 3. The guide slant portion 13 also has a shape of a truncated square pyramid with guide slant faces 13*a* formed along a peripheral portion thereof.

A guide protrusion 14 is provided on the mate-side end face of the guided portion 10 so as to protrude toward the socket 7 side in the connection direction.

The guide protrusion 14 is formed by integrating, by means of insert molding, a plug hold-down member 16 made of a metal plate material with a surface portion of a protrusion base 15 made of an insulating synthetic resin and integrally formed with the guided portion 10. The guide protrusion 14 and the guided portion 10 together form a protruding shape as viewed from the end face thereof in the longitudinal direction.

The plug hold-down member 16 is obtained by bending a conductive metal plate material having a strip shape to be formed in an inverted U-shape with an arc-like top thereof facing upward. The plug hold-down member 16 is integrated with the surface portion of the protrusion base 15 with the outer surface thereof being exposed.

A second-side (the guided portion side) longitudinal-direction guide face 17 is formed at an upper end of the guide protrusion 14 so as to be slidable with a first-side (the guiding portion side) longitudinal-direction guide face, which will be described later and is formed at an edge portion of an opening in the guide groove 8.

The longitudinal-direction guide face 17 is formed by a surface portion of the plug hold-down member 16 so as to have an arc-like cross section bulging upwardly.

The upper end of the protrusion base 15 has slant faces 18 formed along opposite edges thereof in the width direction. The slant faces 18 are slanted toward an inner side in the connection direction. The slant faces 18 form second-side (the guided portion side) width-direction guide faces slidable with first-side (the guiding portion side) width-direction guide faces to be described later.

Furthermore, a top position of the guide protrusion 14, i.e., a length in the connection direction extending from a substrate mounting surface 4*a* of the plug 4 to the apex of the guide protrusion 14, is set to be greater than the overall height of the socket 7. The guide protrusion 14 is configured such that it protrudes toward the substrate b2 beyond a mate-side substrate mounting surface 7*a*, i.e., the lower surface 7*a* of the socket 7 when the plug 4 is fitted into the socket 7.

The socket 7, on the other hand, includes: a socket main body 20 made of an insulating resin material; the plurality of socket-side signal terminals 6; and socket hold-down members 21 made of a conductive metal material as illustrated in FIGS. 6A to 6D. The socket 7 is formed by integrating the socket-side signal terminals 6 and the socket hold-down members 21 with the socket main body 20. The guiding portions 9, each having the guide groove 8, are disposed at opposite ends of a fitting portion 22 of a flat-plate shape.

The fitting portion 22 includes: side walls 24 formed so as to rise from opposite side edges of a flat plate-shaped bottom plate 23 in the width direction; and a central protruding portion 25 disposed at a center portion of the bottom plate 23. The plug insertion grooves 5 each having a recessed groove shape, into which the plug portions 3 are to be inserted, are formed between the side walls 24 and the central protruding portion 25 with a parallel configuration spaced apart from each other in the width direction.

The guiding portions 9 are formed by integrating the socket hold-down members 21 made of a conductive metal plate material with the opposite ends of the socket main body 20. The guiding portions 9 are provided so as to be continuous with the side walls 24 of the fitting portion 22. The guiding portion 9 includes: peripheral walls 26 faced each other in the width direction; and an end wall 27 disposed at an end portion in the longitudinal direction. The guide groove 8 directed in the connection direction is formed by being surrounded by the peripheral walls 26, the end wall 27, and an end face of the fitting portion 22.

The end wall 27 has a first-side (the guiding portion side) longitudinal-direction guide face 28 slanted downwardly toward an inner side in the longitudinal direction at an inner portion of an upper end thereof. The longitudinal-direction guide face 28 slides with the second-side (the guided portion side) longitudinal-direction guide face 17, thereby leading the guide protrusion 14 of the plug 4 to the inner side of the guide groove 8 in the longitudinal direction.

The longitudinal-direction guide face 28 is formed in such a manner that a lower edge thereof is positioned lower than an end face of the fitting portion. Therefore, while keeping the overall height of the socket 7 small, a long distance capable of adjusting positional misalignment is ensured in the longitudinal direction.

An engagement recess 29, having a rectangular cutout shape, is formed at a lower end of the end wall 27 along an inner side surface thereof. An engagement protrusion 30, protruding from the surface of the plug hold-down member 16, is engaged with the engagement recess 29 when the plug 4 is fitted into the socket 7, thereby fixing the plug 4 to the socket 7.

The peripheral wall 26 includes a first-side (the guiding portion side) width-direction guide face 31 slanted downwardly toward an inner side in the width direction. The width-direction guide face 31 slides with the second-side (the guided portion side) width-direction guide face 18, thereby leading the guide protrusion 14 of the plug 4 to the inner side of the guide groove 8 in the width direction.

The width-direction guide faces 31 are disposed at opposite ends of the longitudinal-direction guide face 28 in the width direction, respectively. The longitudinal-direction guide face 28 and the width-direction guide faces 31 together form a U-shape as viewed from above.

An escape hole 32, in communication with the guide groove 8 in the connection direction and passing completely through the substrate mounting surface 7*a*, is provided at the bottom of the guiding portion 9. When the plug 4 is fitted into the socket 7, the guide protrusion 14 provided in the guided portion 10 protrudes farther beyond the socket-side substrate mounting surface 7*a* through the escape hole 32.

Figure 7:
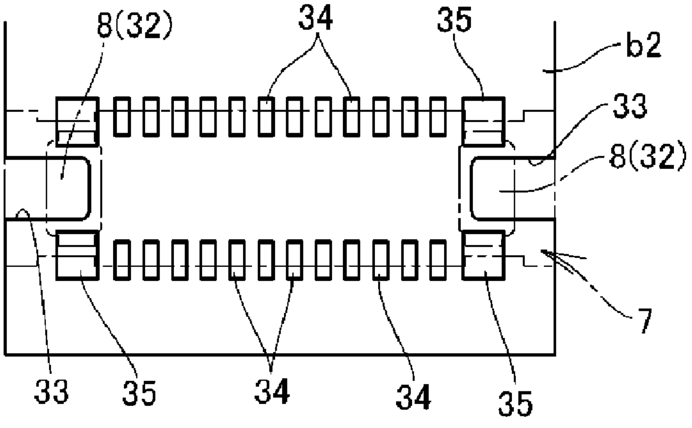
FIG. 7 is a bottom view illustrating an example of the substrate of FIGS. 1A to 1C.

On the other hand, as illustrated in FIG. 7, the substrate b2, onto which the socket 7 is mounted, is provided with escape cutout portions 33 at positions corresponding to the mounting position of the socket 7. The escape cutout portion 33 has a hole shape or a cutout shape, and the guide protrusion 14 is inserted therein.

Note that reference numerals 34 represent signal flow patterns formed on the surface of the substrate b2 and reference numerals 35 represent fixation patterns. Connection terminals 6*a* in the socket-side signal terminals 6 are soldered to the signal flow patterns 34, respectively, and peripheral wall portions of the socket hold-down members 21 are soldered to the fixation patterns 35. As a result, the socket 7 can be mounted on the substrate b2 at a predetermined position.

The escape cutout portions 33 are formed by cutting out opposite side edge portions of the substrate b2 in a recessed shape. The escape cutout portion 33 is formed so as to be continuous with the guide groove 8 and the escape hole 32 of the socket 7 in the connection direction of the connector. The escape cutout portion 33 is provided in order to prevent the guide protrusion 14, protruded farther beyond the mounting surface 7*a* through the escape hole 32 when the plug 4 is fitted into the socket 7, from interfering with the substrate b2.

According to the thus configured substrate connector 1, if a relative position between the plug 4 and the socket 7 is misaligned in the horizontal direction, the guide protrusion 14 is guided by the inner side surface of the guide groove 8, thereby leading the guided portion 10 to the inner side surface portion of the guide groove 8. Then, the outer side surface of the guided portion 10 is guided by the inner side surface of the guide groove 8, thereby enabling the plug 4 to be fitted into the socket 7 at the predetermined position.

Figure 8A:
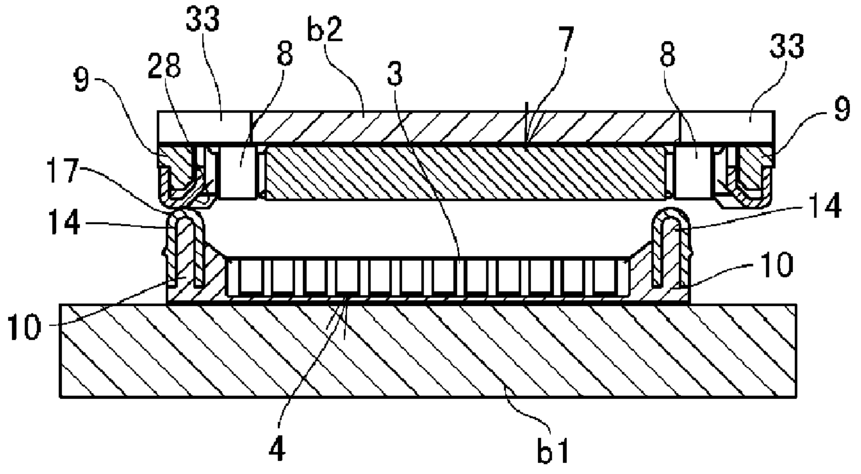
FIGS. 8A, 8B, and 8C are each a partial enlarged cross-sectional view for illustrating the operation of adjusting positional misalignment in the longitudinal direction of the connector.
Figure 8B:
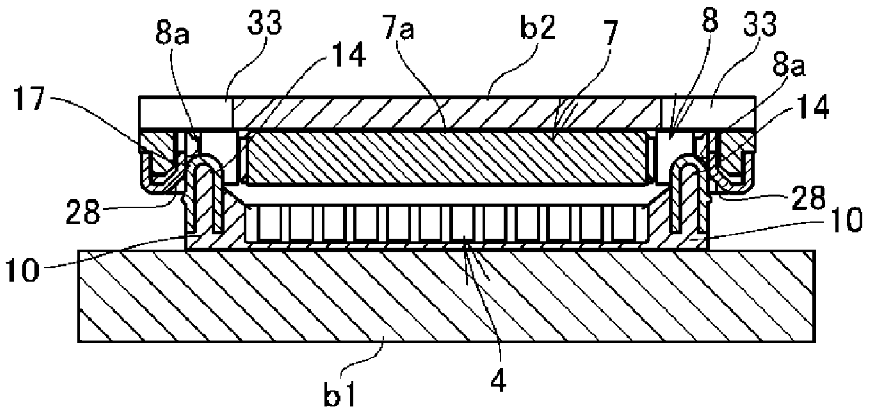
Figure 8C:
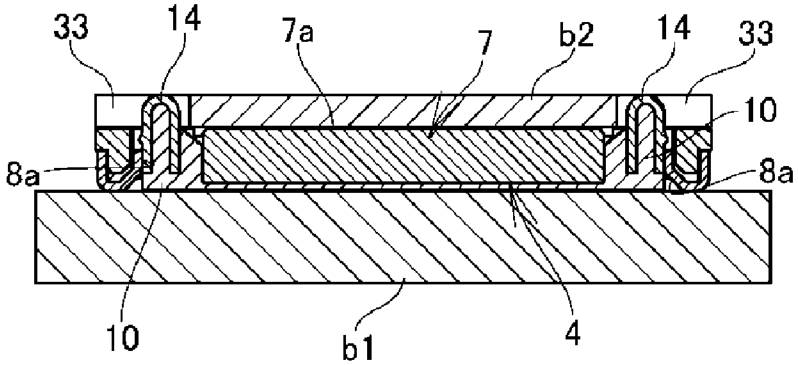

In other words, in a case where a relative position between the plug 4 and the socket 7 is misaligned in the longitudinal direction as illustrated in FIG. 8A, the longitudinal-direction guide face 17 of the guide protrusion 14 first comes in contact with the longitudinal-direction guide face 28. As illustrated in FIGS. 8A and 8B, the longitudinal-direction guide faces 17 and 28 then slide with each other, thereby leading the guide protrusion 14 to the inner side of the guide groove 8 in the longitudinal direction.

An outer side surface of the guide protrusion 14 in the longitudinal direction is guided by an inner side surface 8*a* of the guide groove 8, thereby leading the outer side surface of the guided portion 10 to the inner side of the guide groove 8 in the longitudinal direction. The outer side surface of the guided portion 10 is further guided by the inner side surface 8*a* of the guide groove 8 in the longitudinal direction. Consequently, the plug 4 is fitted into the socket 7 at the predetermined position, and the guide protrusion 14, provided in the guided portion 10, protrudes farther beyond the substrate mounting surface 7*a* of the socket 7 through the escape hole 32 and is inserted into the escape cutout portion 33 of the substrate b2.

As described above, even if the first-side (the guiding portion side) longitudinal-direction guide face 28 is formed in such a manner that the lower edge thereof is positioned lower than the end face of the fitting portion 22 so as to ensure a wide range of distance capable of adjusting positional misalignment in the longitudinal direction while keeping the overall height of the socket 7 small, the substrate connection structure using the substrate connector 1 enables the plug 4 to be reliably fitted into the socket 7 at the predetermined position, thereby preventing unintended contact. This is achieved by the provision of the guide protrusion 14 at the mate-side end face of the guided portion 10. This is because the guide protrusion 14 is always led to the inner side surface 8*a* of the guide groove 8 in the longitudinal direction before being touched by any other portion and the guided portion 10 is led to the inner side surface of the guide groove 8 by the guide protrusion 14 being guided by the guide groove 8.

Figure 9A:
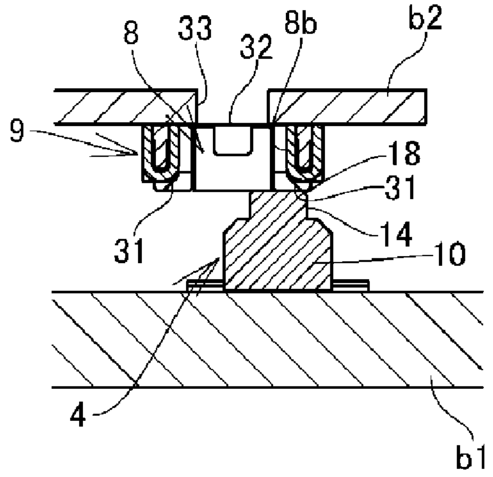
FIGS. 9A, 9B, 9C, and 9D are each a partial enlarged cross-sectional view for illustrating the operation of adjusting positional misalignment in the width direction of the same connector.
Figure 9B:
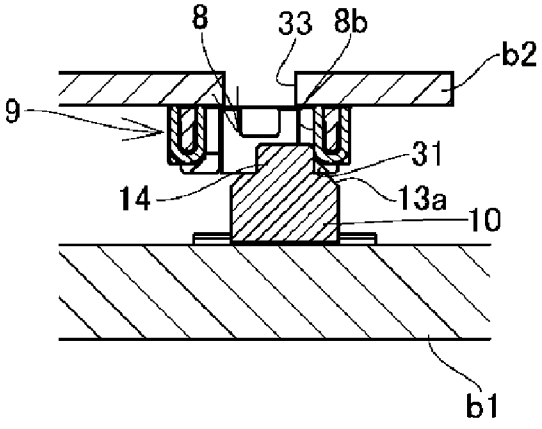

On the other hand, if a relative position between the plug 4 and the socket 7 is misaligned in the width direction as illustrated in FIG. 9A, the second-side (the guided portion side) width-direction guide face 18 in the guide protrusion 14 first comes into contact with the first-side (the guiding portion side) width-direction guide face 31 in the socket 7. As illustrated in FIGS. 9A and 9B, the width-direction guide faces 18 and 31 then slide with each other, thereby leading the guide protrusion 14 to the inner side of the guide groove 8 in the width direction.

Figure 9C:
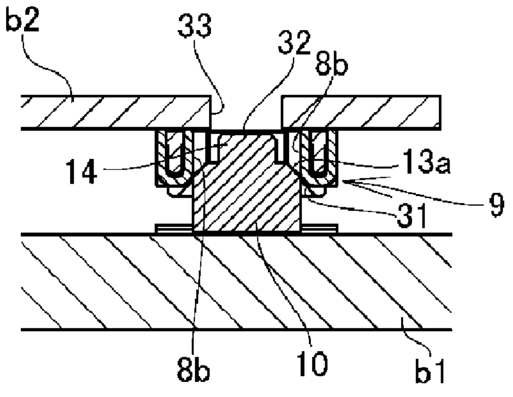

An outer side surface of the guide protrusion 14 is guided by an inner side surface 8*b* of the guide groove 8, thereby allowing the guide slant portion 13 of the guided portion 10 to be in contact with the width-direction guide face 31 as illustrated in FIGS. 9B and 9C. The width-direction guide face 31 and the width-direction slant face 13*a* of the guide slant portion 13 then slide with each other, thereby leading the outer side surface of the guided portion 10 to the inner side of the guide groove 8 in the width direction.

Figure 9D:
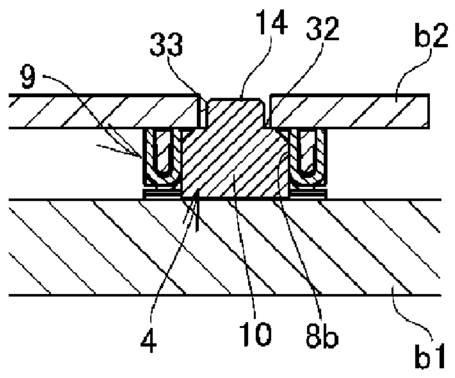
Figure 10A:
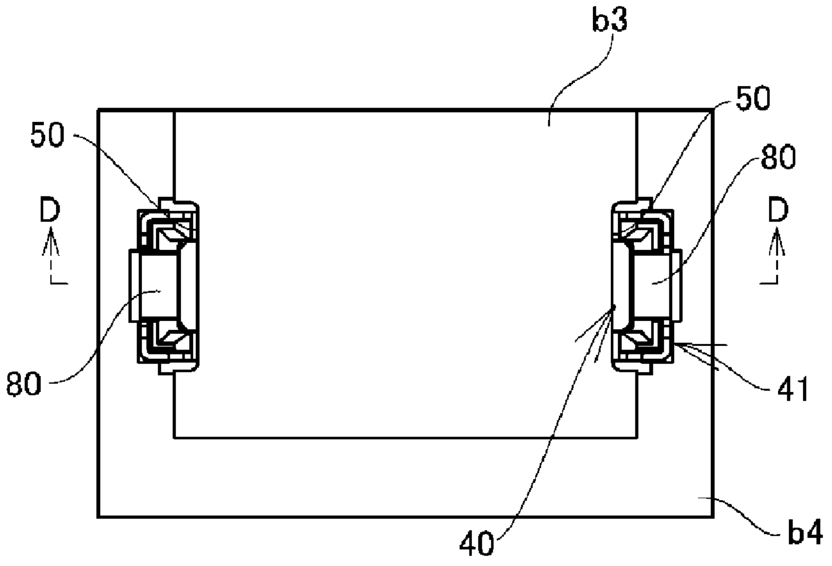
FIG. 10A is a plan view illustrating another example of a substrate connection structure using a substrate connector according to the present invention.
Figure 10B:
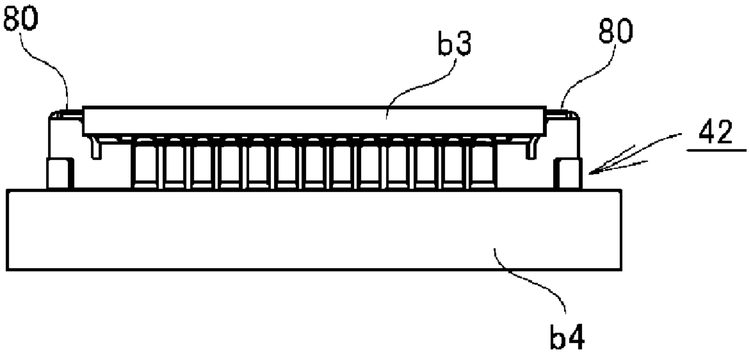
FIG. 10B is an elevation view of the same.
Figure 10C:
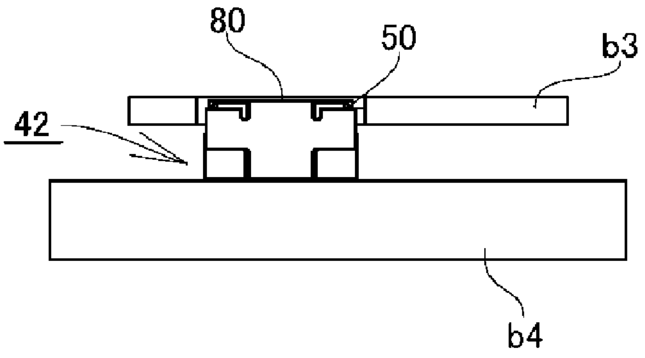
FIG. 10C is a side view of the same.
Figure 11:
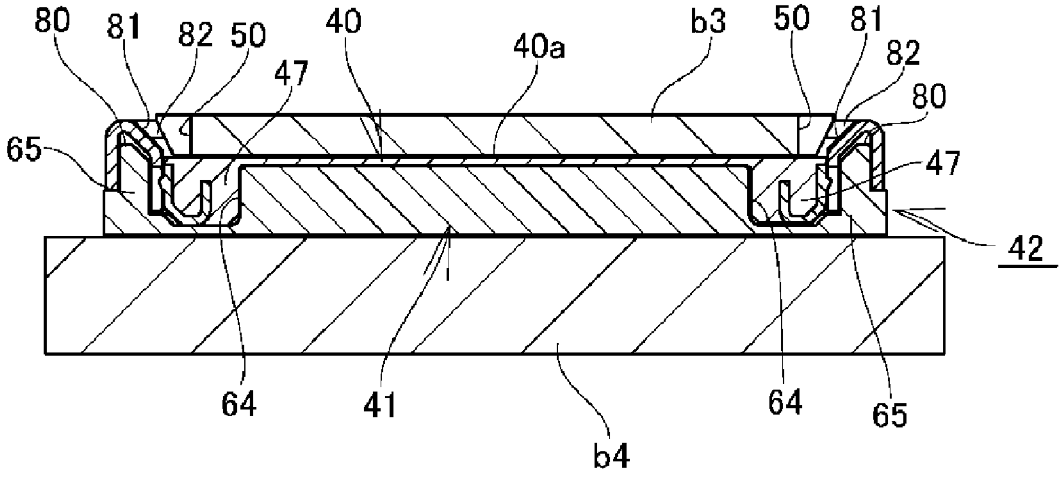
FIG. 11 is a partial enlarged cross-sectional view taken along line D-D of FIG. 10A.
Figure 12:
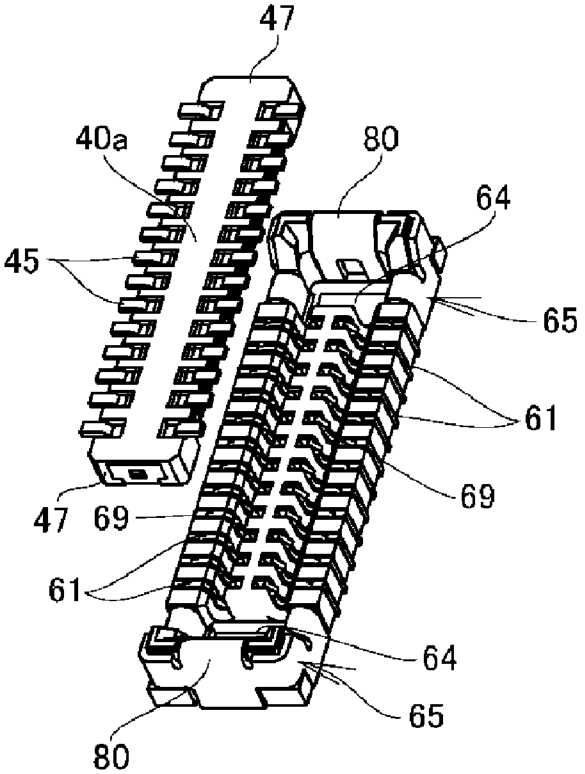
FIG. 12 is a perspective view illustrating the substrate connector of FIGS. 10A to 10C.
Figure 13:
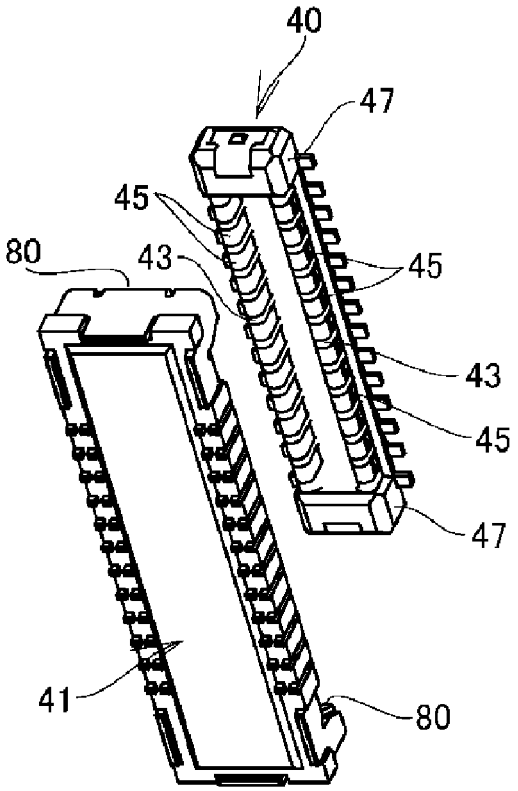
FIG. 13 is a perspective view illustrating the same substrate connector as viewed in another direction.

The outer side surface of the guided portion 10 is further guided by the inner side surface 8*b* of the guide groove 8 in the width direction as illustrated in FIGS. 9C and 9D. Consequently, the plug 4 is fitted into the socket 7 at the predetermined position, and the guide protrusion 14 provided in the guided portion 10 protrudes farther beyond the substrate mounting surface 7*a* of the socket 7 through the escape hole 32 and is inserted into the escape cutout portion 33 of the substrate b2.

Thus, according to the substrate connection structure using the substrate connector 1, the guide protrusion 14 is provided in the guided portion 10 so as to allow the second-side (the guided portion side) width-direction guide face 18 in the guide protrusion 14 to slide with the first-side (the guiding portion side) width-direction guide face 31 in the guide groove for guiding. It is therefore possible to ensure a correspondingly longer distance capable of adjusting positional misalignment.

If a relative position between the plug 4 and the socket 7 is misaligned in both of the longitudinal direction and the width direction, the above-described operations illustrated in FIGS. 8A to 9D are performed in a combined manner so as to lead the guided portion 10 to the inner side of the guide groove 8.

Since the guide protrusions 14 are configured to protrude farther beyond the mate-side substrate mounting surface 7*a* and, at the same time, interference between the guide protrusions 14 and the mate-side substrate b2 is prevented from occurring, a distance between the substrates b1 and b2 when connected can be kept small even when the guide protrusion 14 is provided.

Furthermore, the positions of the guide protrusion 14 and the guided portion 10 can be visually checked through the guide groove 8, the escape hole 32, and the escape cutout portion 33. It is therefore possible to efficiently perform a connecting operation between the substrate b1 and the substrate b2.

A second embodiment of the substrate connection structure using the substrate connector according to the present invention will now be described below based on examples shown in FIGS. 10A to 17C. Note that reference numerals b3 and b4 denote substrates, respectively. The substrate b3 may be an FPC, and the substrate b4 may be a PCB, for example.

This substrate connection structure employs a substrate connector 42 formed by a plug 40 and a socket 41 mounted on the substrates b3 and b4 respectively. The substrate b3 and the substrate b4 are connected to each other via the substrate connector 42.

Figure 14A:
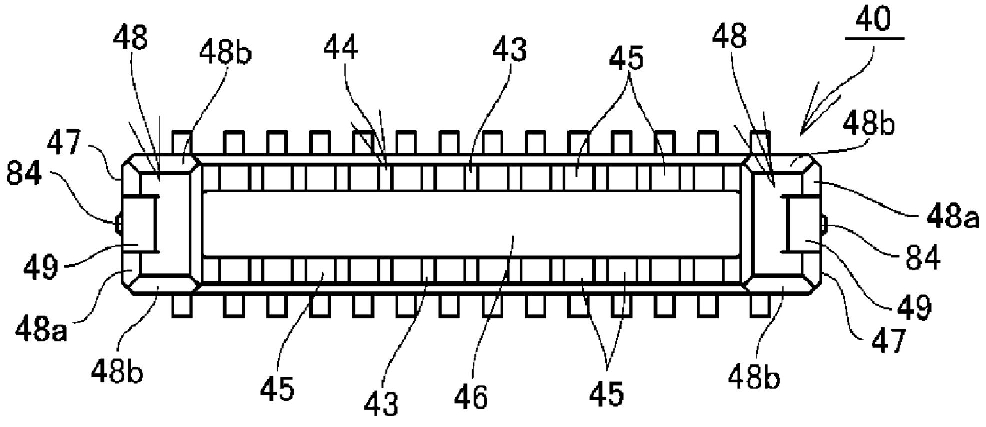
FIG. 14A is a plan view illustrating a plug of FIGS. 10A to 10C.
Figure 14B:
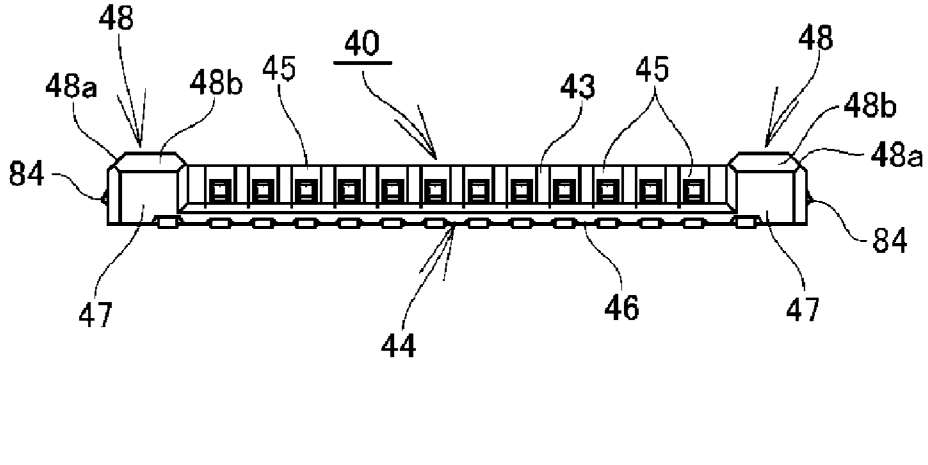
FIG. 14B is an elevation view of the same.
Figure 14C:
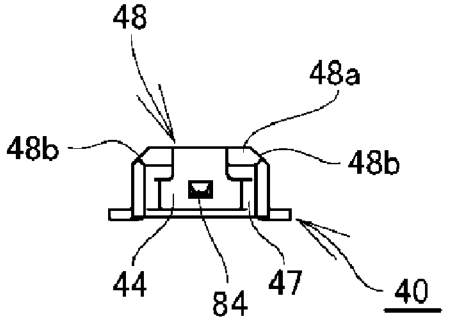
FIG. 14C is a side view of the same.
Figure 15A:
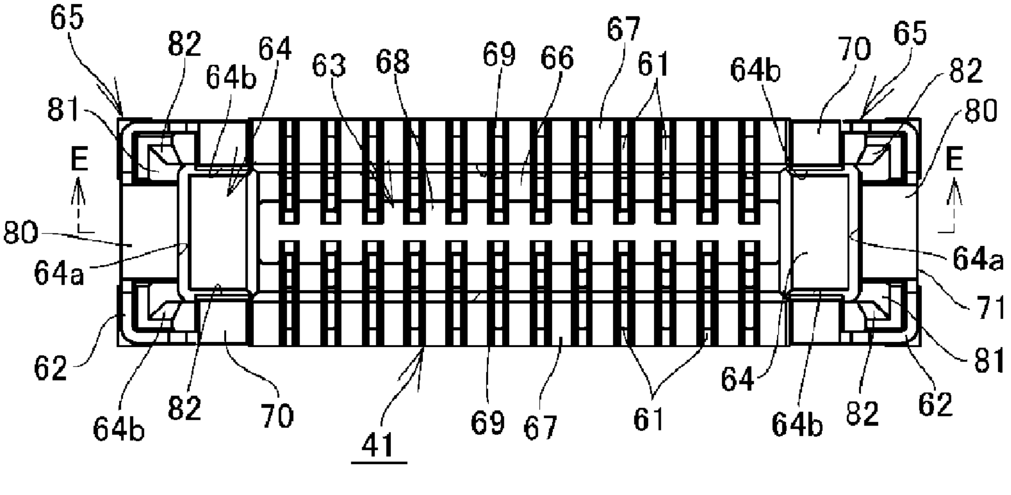
FIG. 15A is a plan view illustrating a socket of FIGS. 10A to 10C.
Figure 15B:
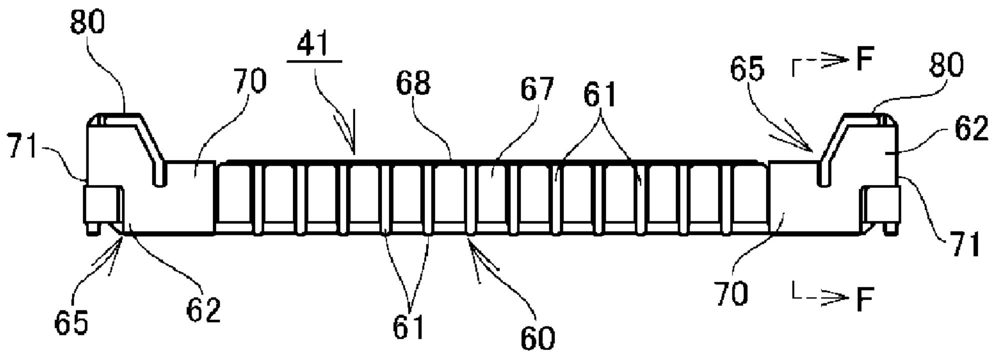
FIG. 15B is an elevation view of the same.
Figure 15C:
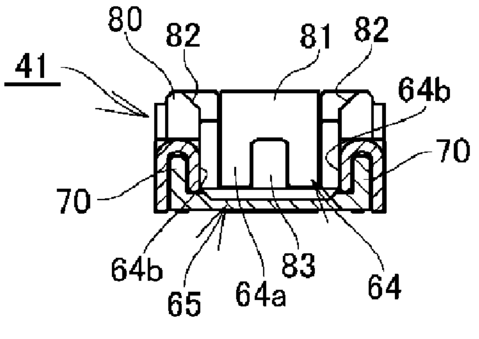
FIG. 15C is a cross-sectional view taken along line F-F of FIG. 15B.
Figure 15D:
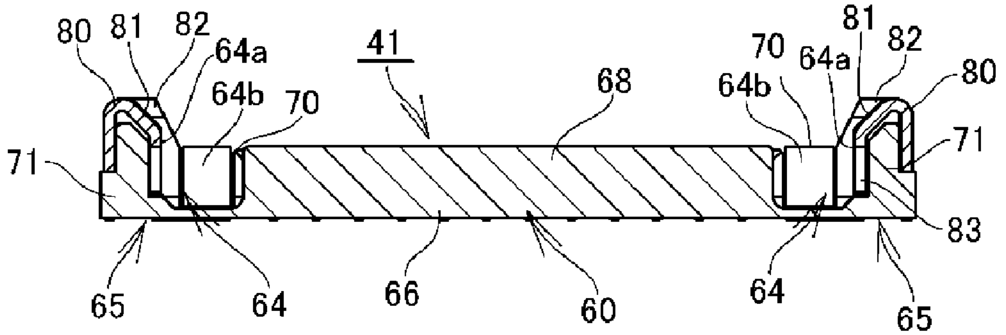
FIG. 15D is a cross-sectional view taken along line E-E of FIG. 15A.

As illustrated in FIGS. 14A to 14C, the plug 40 includes a plug main body 44 made of an insulating resin and having plug portions 43 of an elongated and protruded shape. A plurality of plug-side signal terminals 45 are integrated with the plug main body 44 by means of insert molding.

The plug main body 44 is integrally formed with an insulating synthetic resin. The plug main body 44 includes: a main body base 46 of a flat-plate shape; the plug portions 43 each having an elongated and protruded shape, protruded from a surface of the main body base 46 and extending in the longitudinal direction; and guided portions 47 disposed at opposite ends thereof in the longitudinal direction. The main body base 46 and the plug portions 43 together form a shape such that U-shaped cross sections continuously appear in the longitudinal direction. Also, the plug portions 43 and the guided portions 47 disposed at the opposite ends thereof together form a rectangular frame shape as viewed from above.

The guided portion 47 is formed in a cuboid shape. The guided portion 47 integrally has a guide portion 48, having a shape bulging toward the socket 41 (the mate side), at a socket-side end face thereof.

The guide portion 48 is formed in such a manner that a height of the socket-side end face thereof is greater than that of the plug portions 43. Also, the guide portion 48 has a truncated square pyramid shape including: a first-side (the guided portion side) longitudinal-direction guide face 48*a* formed by a slant surface and provided at a peripheral portion thereof in the longitudinal direction; and first-side (the guided portion side) width-direction guide faces 48*b* formed by slant surfaces and provided at opposite side edges thereof in the width direction.

As illustrated in FIG. 14B, the lower edges of the guide faces 48*a* and 48*b* are positioned so as to be lower than the top of the plug portion 43. Therefore, large distances of the guide faces 48*a* and 48*b* in the horizontal direction, i.e., distances capable of adjusting positional misalignment, are ensured while keeping the overall height of the plug 40 small correspondingly.

Note that reference numeral 49 denotes a plug hold-down member being integrated with the plug main body 44 by means of insert molding.

The substrate b3, onto which the plug 40 is mounted, is provided with escape cutout portions 50 at opposite side edge portions thereof corresponding to the mounting position of the plug 40. The escape cutout portion 50 has a hole shape or a cutout shape, and a guide protrusion to be described later is inserted therein. When the plug 40 is mounted on the substrate b3, the opposite ends of the plug 40 are exposed through the respective escape cutout portions 50, thereby allowing for the visual check of the positions thereof.

The socket 41, on the other hand, includes: a socket main body 60 made of an insulating resin material; a plurality of socket-side signal terminals 61; and socket hold-down members 62 made of a conductive metal material as illustrated in FIGS. 15A to 15D. The socket 41 is formed by integrating the socket-side signal terminals 61 and the socket hold-down members 62 with the socket main body 60. Guiding portions 65, each having a guide groove 64, are disposed at opposite ends of a fitting portion 63 of a flat-plate shape.

The fitting portion 63 includes: side walls 67 formed so as to rise from opposite side edges of a flat plate-shaped bottom plate 66 in the width direction; and a central protruding portion 68 disposed at a center portion of the bottom plate 66. Plug insertion grooves 69 each having a recessed groove shape, into which the plug portions 43 are to be inserted, are formed between the side walls 67 and the central protruding portion 68 with a parallel configuration spaced apart from each other in the width direction.

The guiding portions 65 are formed by integrating the socket hold-down members 62, made of a conductive metal plate material, with the opposite ends of the socket main body 60. The guiding portions 65 are provided so as to be continuous with the side walls 67 of the fitting portion 63. The guiding portions 65 include: peripheral walls 70 faced each other in the width direction; and end walls 71 disposed at opposite ends in the longitudinal direction. The guide groove 64 directed in the connection direction is formed by being surrounded by the peripheral walls 70, the end wall 71, and an end face of the fitting portion 63.

A guide protrusion 80 is provided on the mate-side (i.e., the plug 40 side) end face of the guiding portion 65 so as to protrude toward the plug side in the connection direction.

The guide protrusion 80 is provided over an area extending from the end wall 71 to the peripheral walls 70. The top position of the guide protrusion 80, i.e., a distance in the vertical direction from a substrate mounting surface 41*a* of the socket 41 to the apex of the guide protrusion 80, is set to be greater than the overall height of the plug 40. When the plug 40 is fitted into the socket 41, the guide protrusions 80 pass laterally to the opposite ends of the plug 40 in the longitudinal direction and protrude farther toward the substrate b3 beyond a mate-side substrate mounting surface 40*a*, i.e., the lower surface 40*a* of the plug 40.

The guide protrusion 80 includes, at inner side surface portions thereof, a second-side (the guiding portion side) longitudinal-direction guide face 81 and second-side (the guiding portion side) width-direction guide faces 82 so as to be continuous with the guide groove 64. The second-side (the guiding portion side) longitudinal-direction guide face 81 and the first-side (the guided portion side) longitudinal-direction guide face 48*a* slide with each other, and the second-side (the guiding portion side) width-direction guide faces 82 and the first-side (the guided portion side) width-direction guide faces 48*b* slide with each other. As a result, the guided portion 47 is led into the guide groove 64.

The longitudinal-direction guide face 81 is formed in a shape slanted downwardly toward the inner side in the longitudinal direction. A longitudinal-direction inner side surface 64*a* of the guide groove 64 is formed downwardly in the vertical direction continuously from the lower edge of the longitudinal-direction guide face 81.

The width-direction guide faces 82 each are formed in a shape slanted downwardly toward the inner side in the width direction. The width-direction guide faces 82 are disposed at the opposite ends of the longitudinal-direction guide face 81. The longitudinal-direction guide face 81 and the width-direction guide faces 82 together form a U-shape as viewed from above.

An engagement recess 83, having a rectangular cutout shape, is formed at a lower end of the end wall 71 along an inner side surface portion thereof. An engagement protrusion 84, protruding from the surface of the plug hold-down member 49, is engaged with the engagement recess 83 when the plug 40 is fitted into the socket 41, thereby fixing the plug 40 to the socket 41.

According to the thus configured substrate connector 42, if a relative position between the plug 40 and the socket 41 is misaligned in the horizontal direction, the guided portion 47 is guided by the guide protrusion 80, thereby being led to the inner side of the guide groove 64. Then, the outer side surface of the guided portion 47 is guided by the inner side surface of the guide groove 64, thereby enabling the plug 40 to be fitted into the socket 41 at the predetermined position.

Figure 16A:
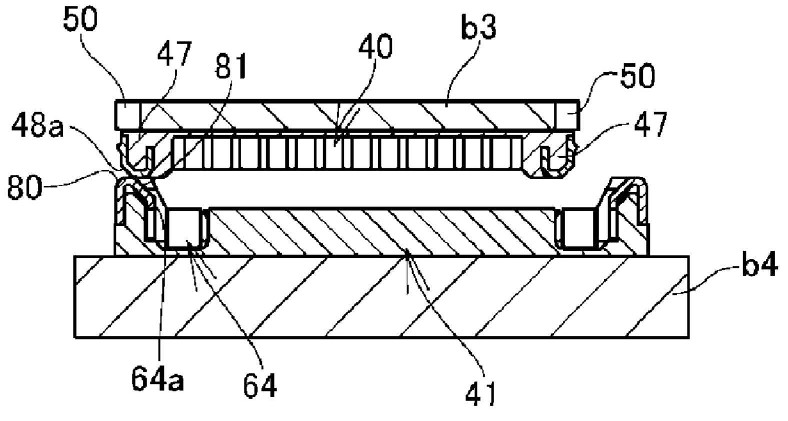
FIGS. 16A, 16B, and 16C are each a partial enlarged cross-sectional view for illustrating the operation of adjusting positional misalignment in the longitudinal direction.
Figure 16B:
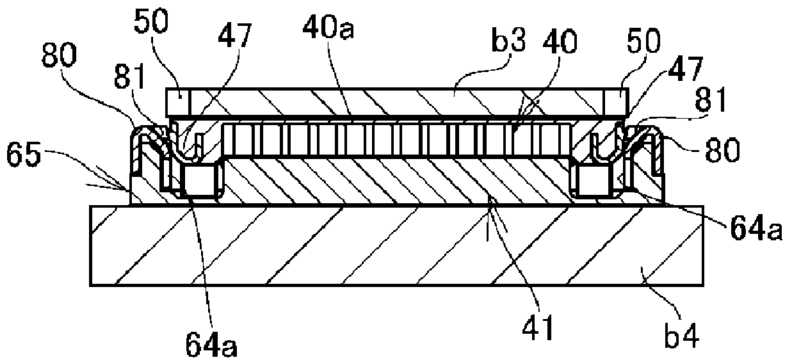
Figure 16C:
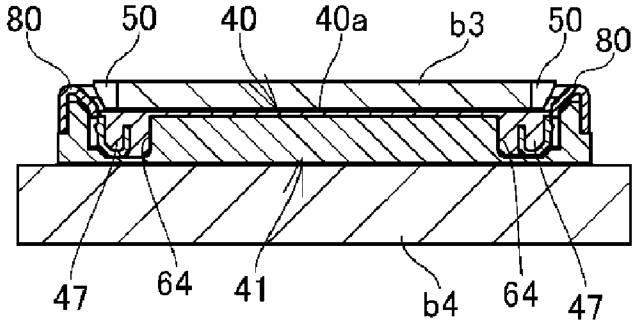

In other words, in a case where a relative position between the plug 40 and the socket 41 is misaligned in the longitudinal direction as illustrated in FIG. 16A, the first-side longitudinal-direction guide face 48*a* in the guided portion 47 first comes into contact with the second-side longitudinal-direction guide face 81 in the guide protrusion 80. As illustrated in FIGS. 16A and 16B, the longitudinal-direction guide faces 48*a* and 81 then slide with each other, thereby leading the guided portion 47 to the inner side of the guide groove 64 in the longitudinal direction.

Then, an outer side surface of the guided portion 47 is guided by the inner side surface 64*a* of the guide groove 64 in the longitudinal direction, thereby enabling the plug 40 to be fitted into the socket 41 at the predetermined position. The guide protrusions 80 pass laterally to the opposite ends of the plug 40 in the longitudinal direction and protrude farther toward the substrate b3 beyond the substrate mounting surface 40*a* of the plug 40.

Providing the escape cutout portions 50 in the substrate b3 prevents interference between the guide protrusions 80 and the substrate b3 from occurring on such an occasion.

Figure 17A:
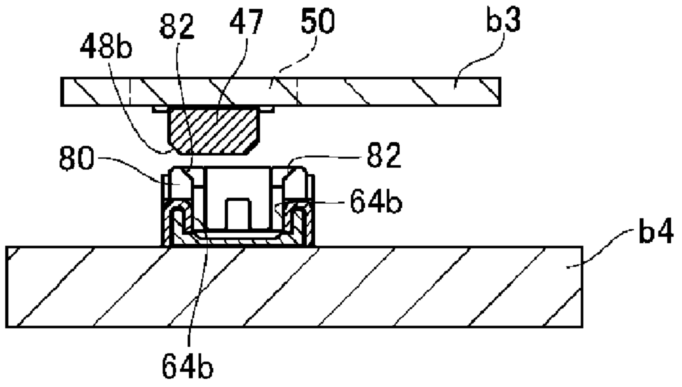
FIGS. 17A, 17B, and 17C are each a partial enlarged cross-sectional view for illustrating the operation of adjusting positional misalignment in the width direction of the same connector.
Figure 17B:
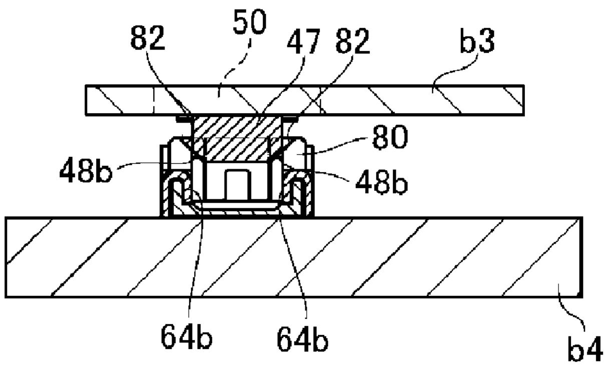

On the other hand, if a relative position between the plug 40 and the socket 41 is misaligned in the width direction as illustrated in FIG. 17A, the width-direction guide face 48*b* of the guided portion 47 first comes into contact with one of the width-direction guide faces 82 in the guide protrusion 80. As illustrated in FIGS. 17A and 17B, the width-direction guide faces 48*b* and 82 then slide with each other, thereby leading the guided portion 47 to the inner side of the guide groove 64 in the width direction.

Figure 17C:
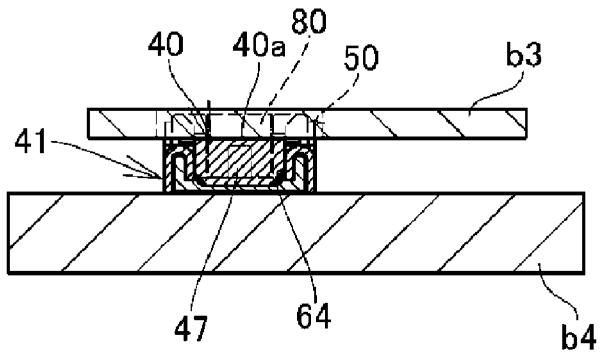

Then, as illustrated in FIGS. 17B and 17C, the outer side surface of the guided portion 47 is guided by the inner side surface 64*b* of the guide groove 64 in the width direction, thereby enabling the plug 40 to be fitted into the socket 41 at the predetermined position. The guide protrusions 80 pass laterally to the opposite ends of the plug 40 in the longitudinal direction and protrude farther beyond the substrate mounting surface 40*a*.

Providing the escape cutout portions 50 in the substrate b3 prevents interference between the guide protrusions 80 and the substrate b3 from occurring on such an occasion.

If a relative position between the plug 40 and the socket 41 is misaligned in both of the longitudinal direction and the width direction, the above-described operations illustrated in FIGS. 16A to 17C are performed in a combined manner so as to lead the guided portion 47 to the inner side of the guide groove 64.

Even if the first-side guide faces 48*a* and 48*b* are formed in such a manner that the lower edges thereof are positioned lower than the end face of the plug portion 43 so as to ensure a wide range of distance capable of adjusting positional misalignment while keeping the overall height of the plug 40 small, the substrate connection structure using the thus configured substrate connector 42 can prevent unintended contact between the plug 40 and the socket 41 by the provision of the guide protrusion 80 at the mate-side end face of the guiding portion 65. This is because the guided portion 47 is always led to the inner side of the guide groove 64 by the guide protrusion 80 before being touched by any other portion.

Since the guide protrusions 80 are configured to protrude farther beyond the mate-side substrate mounting surface 40*a* and, at the same time, interference between the guide protrusions 80 and the mate-side substrate b3 is prevented from occurring, a distance between the substrates when connected can be kept small.

Furthermore, the positions of the guide protrusions 80 and the plug 40 can be visually checked through the opposite end portions of the substrate b3. It is therefore possible to efficiently perform connection between the substrates b3 and b4.

The above-described embodiments describe a case where the recessed escape cutout portions are provided in the substrate b2 or b3 in order to avoid interference between the guide protrusions and the mate-side substrate. However, a mode for avoiding interference between the guide protrusions and the mate-side substrate is not limited to the above-described embodiments. For example, hole-shaped escape cutout portions may be provided. Also, a width of the substrates b2 and b3 may be formed smaller than a distance between the opposite guide protrusions so that the guide protrusions protrude laterally to the side edge portions of the substrates b2 and b3.

The configurations of the plugs 4 and 40 and the sockets 7 and 41 are not limited to those described in the embodiments above. For example, a configuration including a single plug portion 3 or 43 may be employed. Alternatively, three or more plug portions may be provided.

The case where the guided portions are provided in the plug and the guiding portions are provided in the socket has been described in the above-described embodiments. Depending on the structure, however, the guiding portions may be provided in the plug and the guided portions may be provided in the socket.

LIST OF REFERENCE SIGNS b1 Substrate (PCB)
b2 Substrate (FCP)
1 Substrate connector (42)
2 Plug-side signal terminal
3 Plug portion
4 Plug
5 Plug insertion groove
6 Socket-side signal terminal
7 Socket (41)
8 Guide groove
9 Guiding portion
10 Guided portion
11 Plug main body
12 Main body base
13 Guide slant portion
14 Guide protrusion
15 Protrusion base
16 Plug hold-down member (49)
17 Longitudinal-direction guide face
18 Width-direction guide face (slant face)
20 Socket main body
21 Socket (41) hold-down member
22 Fitting portion
23 Bottom plate
24 Side wall
25 Central protruding portion
26 Peripheral wall
27 End wall
28 Socket (41) side guide face
29 Engagement recess
30 Engagement protrusion

31 Socket (41) side guide face
32 Escape hole
33 Escape cutout portion
34 Signal flow pattern
35 Fixation pattern
b3 Substrate (FPC)
b4 Substrate (PCB)
40 Plug
41 Socket
42 Substrate connector
43 Plug portion
44 Plug main body
45 Plug-side signal terminal
46 Main body base
47 Guided portion
48 Guide portion
49 Plug hold-down member
50 Escape cutout portion
60 Socket main body
61 Socket-side signal terminal
62 Socket hold-down member
63 Fitting portion
64 Guide groove
65 Guiding portion
66 Bottom plate
67 Side wall
68 Central protruding portion
69 Plug insertion groove
70 Peripheral wall
71 End wall
80 Guide protrusion
81 Longitudinal-direction guide face
82 Width-direction guide face
83 Engagement recess
84 Engagement protrusion

The invention claimed is:

1. A substrate connection structure using a substrate connector, the substrate connector including a plug and a socket to be mounted on substrates, respectively, and fitted together, one of the plug and the socket including a guiding portion having a guide groove directed in a connection direction, the other of the plug and the socket including a guided portion to be fitted into the guide groove, the guided portion being guided by an inner side surface of the guide groove, thereby enabling the plug to be fitted into the socket at a predetermined position, wherein a guide protrusion is provided at a mate-side end face of the guided portion and/or the guiding portion so as to protrude farther beyond a mate-side substrate mounting surface when the plug is fitted into the socket, a first-side guide face is formed in the guided portion or an edge portion of an opening in the guide groove and the guide protrusion is provided with a second-side guide face slidable with the first-side guide face so as to lead the guided portion into the guide groove, and interference between the guide protrusion and the mate-side substrate is prevented from occurring.

2. The substrate connection structure according to claim 1, wherein an escape hole, in communication with the guide groove and passing completely through the mate-side substrate mounting surface, is provided in the guiding portion and the guide protrusion provided in the guided portion protrudes farther beyond the mate-side substrate mounting surface through the escape hole.

3. The substrate connection structure according to claim 1, wherein an escape cutout portion having any of a hole shape and a cutout shape for the guide protrusion to be inserted therein is provided in the substrate.

* * * * *